United States Patent

Oowaki et al.

Patent Number: 6,112,163
Date of Patent: *Aug. 29, 2000

[54] SEMICONDUCTOR INTEGRATED CIRCUIT AND TEST METHOD THEREFOR

[75] Inventors: Yukihito Oowaki; Masatoshi Sekine, both of Kanagawa; Hiroshige Fujii, Tokyo, all of Japan

[73] Assignee: Kabushiki Kaisha Toshiba, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/038,373

[22] Filed: Mar. 11, 1998

[30] Foreign Application Priority Data

Mar. 12, 1997 [JP] Japan .................................. 9-057931

[51] Int. Cl.⁷ .................................................. G01R 15/12
[52] U.S. Cl. ........................................... 702/117; 702/118
[58] Field of Search .................................. 702/117, 108, 702/118; 324/500, 537, 763, 765; 714/725, 733, 739, 759, 760

[56] References Cited

U.S. PATENT DOCUMENTS

| | | | |
|---|---|---|---|
| 3,636,443 | 1/1972 | Singh et al. | 714/736 |
| 3,826,909 | 7/1974 | Ivashin | 714/776 |
| 4,122,995 | 10/1978 | Franke | 714/700 |
| 4,188,670 | 2/1980 | Hsia | 365/49 |
| 4,291,386 | 9/1981 | Bass | 364/717 |
| 4,340,857 | 7/1982 | Fasang | 714/733 |
| 4,816,757 | 3/1989 | Hutchins | 324/158 R |
| 4,942,576 | 7/1990 | Busack et al. | 714/719 |
| 5,123,059 | 6/1992 | Hirosawa et al. | 382/50 |
| 5,546,406 | 8/1996 | Gillenwater et al. | 371/22.5 |
| 5,577,199 | 11/1996 | Tanabe et al. | 395/183.13 |
| 5,784,636 | 7/1998 | Rupp | 395/800.37 |
| 5,831,996 | 11/1998 | Abramovici et al. | 714/738 |

OTHER PUBLICATIONS

"XC6200 Field Programmable Gate Arrays", Xilinx, Jan. 9, 1997, pp. 1–53.

*Primary Examiner*—Marc S. Hoff
*Assistant Examiner*—Craig Steven Miller
*Attorney, Agent, or Firm*—Oblon, Spivak, McClelland, Maier & Neustadt, P.C.

[57] ABSTRACT

A reconfigurable circuit is reconstructed to three or more operating circuit blocks. Upon testing, the same data is inputted to each of the reconstructed operating circuit blocks. A majority circuit formed in the reconfigurable circuit compares results of operations of the operating circuit blocks and outputs information indicating which of the operating circuit blocks is in trouble.

16 Claims, 6 Drawing Sheets

(a)

(b)                                                  (c)

(d)

SEMICONDUCTOR INTEGRATED CIRCUIT AND TEST METHOD THEREFOR

BACKGROUND OF THE INVENTION

1. Field of the Invention

This invention relates to a semiconductor integrated circuit having a reconfigurable circuit wherein a circuit structure thereof can be changed according to an external signal input to a configuration memory or the like, and a test method therefor.

2. Related Art

In recent years, a reconfigurable circuit wherein a circuit structure thereof can be changed according to an external signal or the like has been further demanded due to its flexibility of use.

However, it has been pointed out that because in such a reconfigurable circuit, (1) its structure is variable and (2) chip cost increases if a probe pad is disposed therein, this circuit is difficult to test.

FIG. 1 shows a test method for a conventional reconfigurable circuit.

Upon testing, first, the reconfigurable circuit 110 is constructed with reconfigurable function units (RFU) 111 such as parallel multiplier or the like, according to an external data SO. Then, for example, multiplication data X, Y are inputted to the input side of this RFU 111 and output Z is obtained so as to verify whether or not an error occurs.

However, according to the aforementioned conventional test method, the combination of the input vectors X, Y increases tremendously and the number of output pins for verifying the output Z also increases. Further, to verify output data, a high speed tester corresponding to internal operation frequency is needed, so that the circuit test becomes complicated.

SUMMARY OF THE INVENTION

The present invention has been proposed to solve the problems mentioned above. An object of the invention is to provide a semiconductor integrated circuit capable of facilitating a test procedure for a reconfigurable circuit and a test method therefor. Another object of the invention is to provide a semiconductor integrated circuit capable of facilitating a test procedure for the reconfigurable circuit and inhibiting use of a faulty block and a test method therefor.

To achieve the object mentioned above, there is provided a semiconductor integrated circuit containing a reconfigurable circuit wherein a circuit structure thereof can be changed, the reconfigurable circuit being reconstructed with three or more operating circuit blocks to which same data is inputted upon testing.

According to a preferable embodiment of the present invention, the reconfigurable circuit further comprises a comparing circuit for comparing the results of operations of the operating circuit blocks with each other and outputting information indicating which of the operating circuit blocks is particular.

According to another preferable embodiment of the present invention, the reconfigurable circuit is reconstructed so as to contain a random number generating circuit for generating random numbers as the same data.

According to still another preferable embodiment of the present invention, the semiconductor integrated circuit further comprises a memory means for storing information of an operating circuit block testified to be particular by the comparing circuit.

According to a further preferable embodiment of the present invention, each of the operating circuit blocks is constructed by connecting a plurality of 3-input lookup tables on multiple stages.

According to a still further preferable embodiment of the present invention, the comparing circuit is a majority circuit.

Further, to achieve the object mentioned above, there is provided a test method for a semiconductor integrated circuit having a reconfigurable circuit wherein a circuit structure thereof can be changed, the test method comprising the steps of: reconstructing the reconfigurable circuit with three or more equivalent operating circuit blocks; and inputting the same data to each of the operating circuit blocks.

According to a preferable embodiment of the present invention, results of operations of the operating circuit blocks are compared with each other after the same data is inputted to each of the operating circuit blocks; and information is output indicating a particular one of the operating circuit blocks.

According to another preferable embodiment of the present invention, the same data to be inputted to each of the operating circuit blocks is pseudorandom number data to be outputted from a random number generating circuit.

According to still another preferable embodiment of the present invention, the information indicating a particular one of the operating circuit blocks is stored.

The nature, principle and utility of the invention will become more apparent from the following detailed description when read in conjunction with the accompanying drawings.

DETAILED DESCRIPTION OF THE PREFERRED EMBODIMENTS

Figure 1:
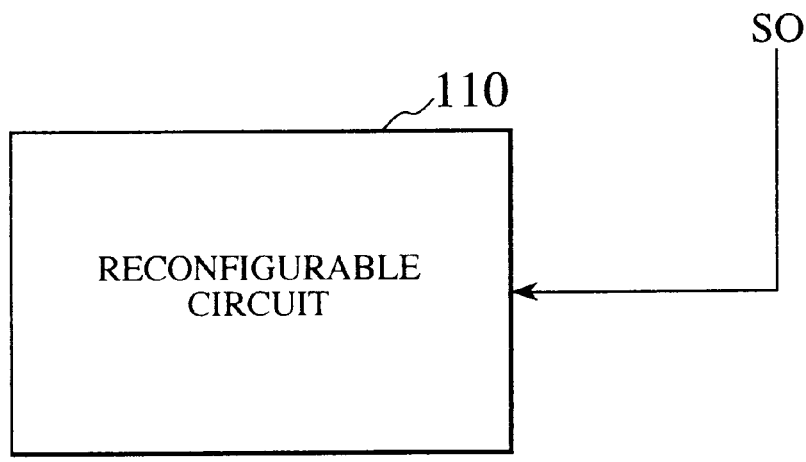
FIG. 1 is a diagram showing a conventional test method for a reconfigurable circuit.
Figure 1:
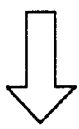
Figure 1:
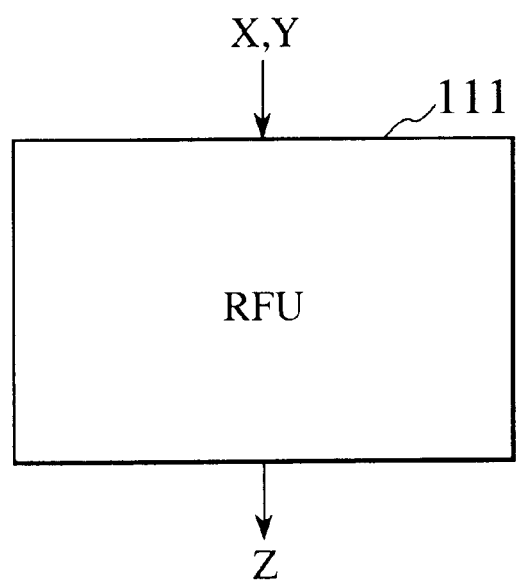
Figure 2:
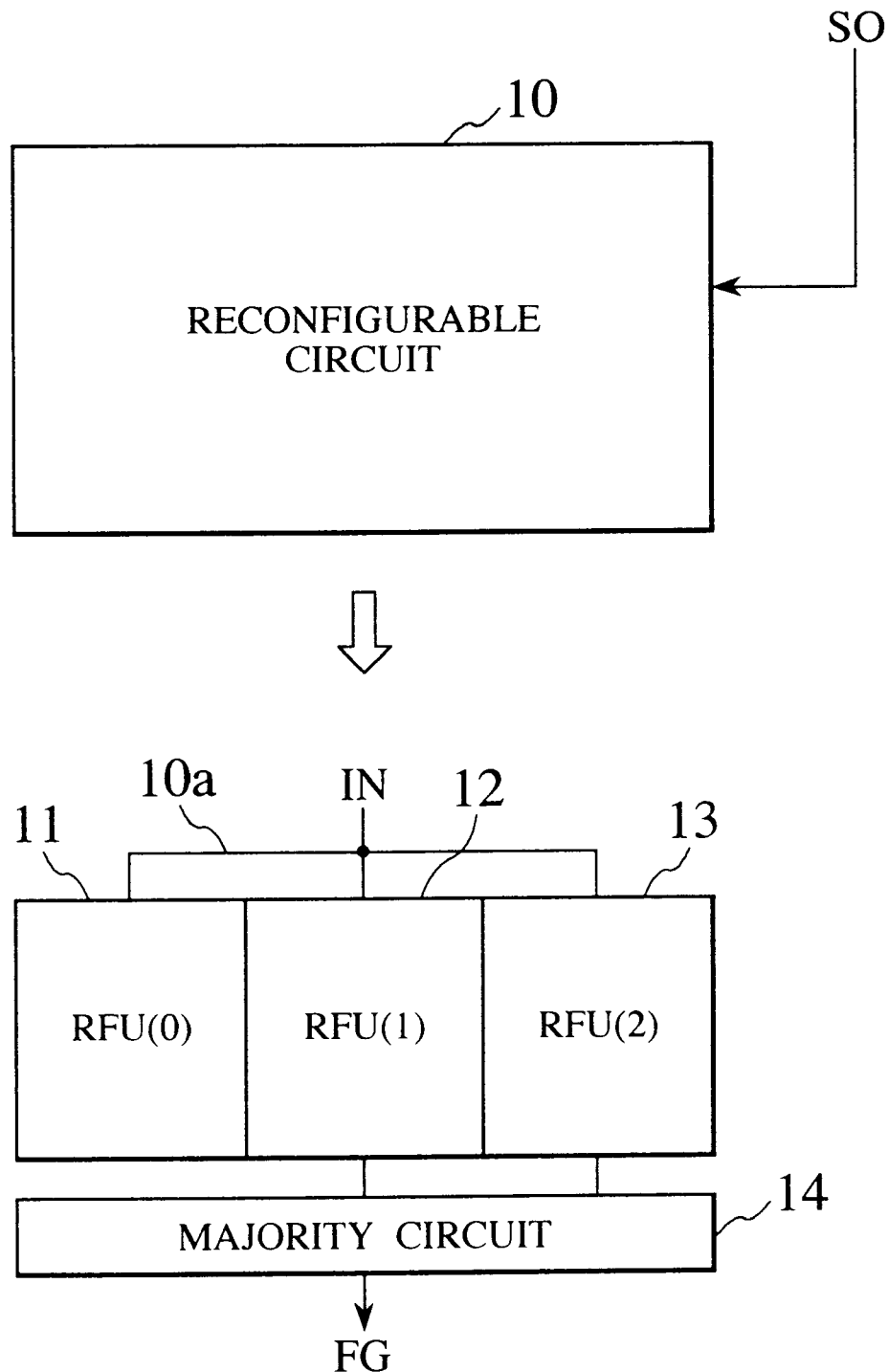
FIG. 2 is a diagram showing a test method for a semiconductor integrated circuit according to a first embodiment of the present invention.

Hereinafter, the embodiment of the present invention will be described with reference to the accompanying drawings. FIG. 2 is a diagram showing a method for testing a semiconductor integrated circuit according to a first embodiment of the present invention.

This reconfigurable circuit 10 is reconstructed as a reconfigurable function unit (hereinafter referred to as RFU) for achieving a predetermined operation function (parallel multiplier or the like) which is one of the function units (FU) of the processor.

Figure 3:
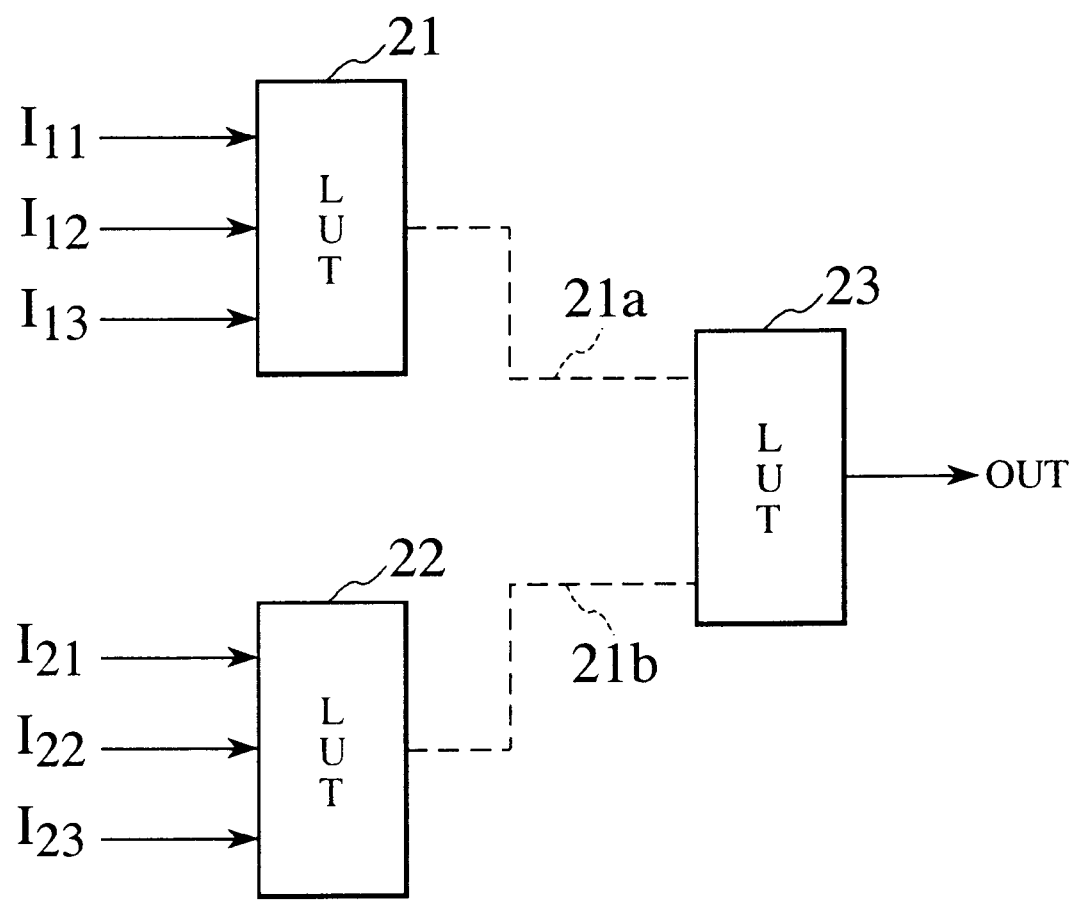
FIG. 3 is a diagram showing an example of a method for constructing the reconfigurable circuit.

FIG. 3 is a diagram showing an example of a method for constructing the reconfigurable circuit 10. This reconfigurable circuit 10 is constructed by connecting a plurality of 3-input lookup tables (LUT) on multiple stages. The 3-input lookup tables 21, 22, 23 are composed of EEPROM or SRAM, so that "1" is set by only a particular combination of the three inputs. Here, the particular combination of the three inputs which sets "1" is changeable or reconfigurable depending on data to be written into the table. By connecting these, a multiple-input circuit is structured. Connecting lines 21a, 21b for the multiple stage connection are variable in programmable manner.

The method for constructing the reconfigurable circuit 10 may be not only of lookup table type using the aforementioned memory, but also multiplexer (MUX) type.

To test the reconfigurable circuit 10, as shown at bottom of FIG. 2, the reconfigurable circuit 10 is divided into three equivalent circuits, that is, RFU(0) 11, RFU(1) 12 and RFU (2) 13 according to the external signal SO. Although according to the present embodiment, the reconfigurable circuit 10 is divided to three RFUs, this is a minimum number, so that the RFU may be divided into more than three. A majority circuit 14 for comparing the output results of the RFUs 11, 12, 13 is composed of a part of the reconfigurable circuit 10.

The same data is supplied to the reconstructed reconfigurable circuits 10, RFU11, 12, 13 through an input signal line 10a. Calculations are performed using the input data in the RFUs 11–13 and the results of the calculation are compared by the majority circuit 14. If any one does not correspond to each other, a flag FG indicating what computing element data is different is outputted from an output end of the majority circuit 14. If any data is different, this is abolished as a fault product or use of that faulty circuit block is inhibited.

According to the test method of the present embodiment, not only the tester circuit is not required but also the input vector can be reduced (dimension of the input vector can be lowered) because the reconfigurable circuit 10 has been divided to RFUs 11, 12, 13, so that as compared to the conventional method, the test procedure can be largely facilitated.

Next, a second embodiment of the present invention will be described.

According to the second embodiment, upon testing, pseudorandom numbers are generated by a random number generating circuit so as to automatically produce an input vector.

Figure 4:
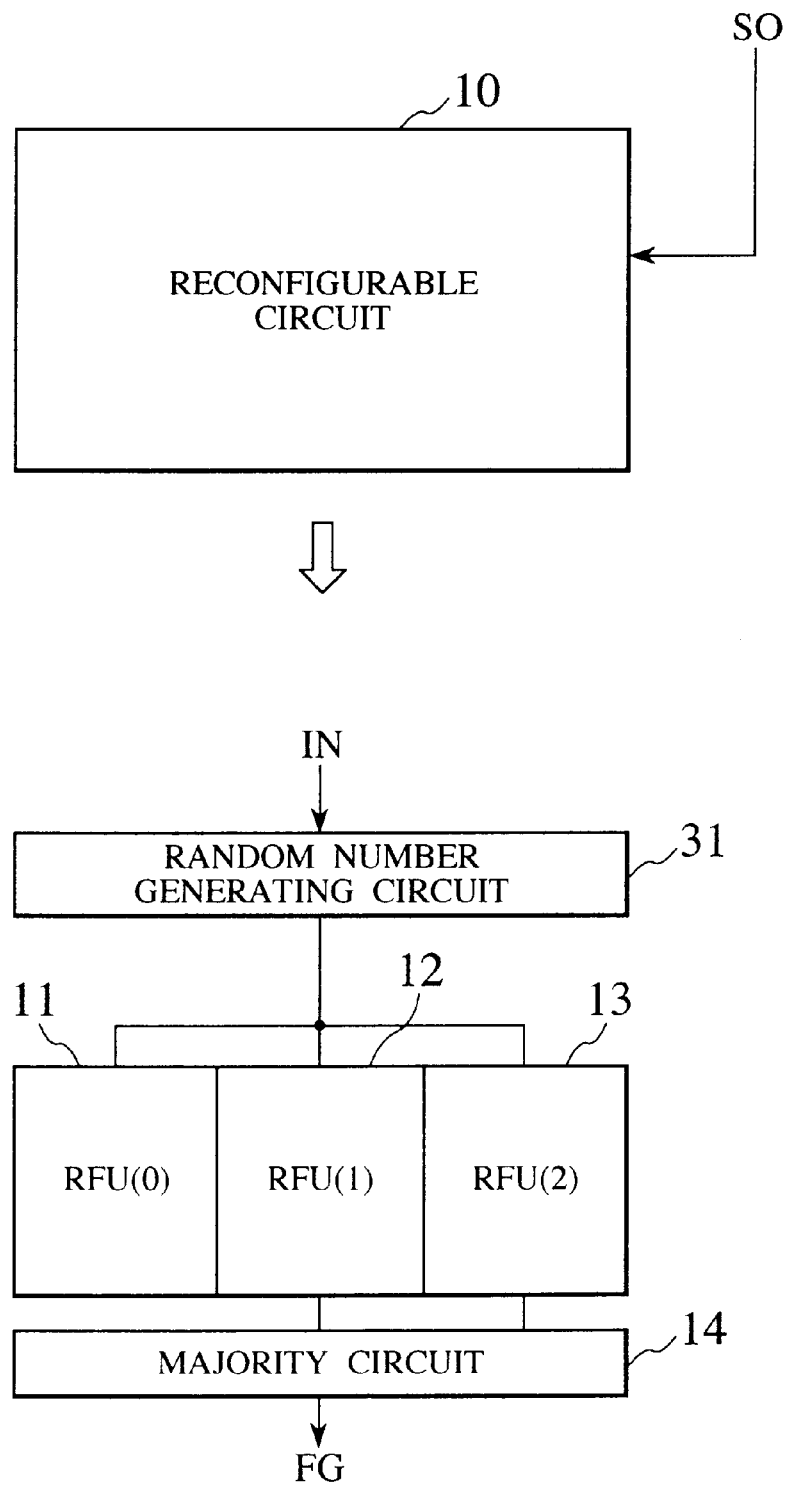
FIG. 4 is a diagram showing a test method for a semiconductor integrated circuit according to a second embodiment of the present invention.

FIG. 4 is a diagram showing a method for testing the semiconductor integrated circuit according to a second embodiment of the present invention. The same reference numerals are attached to the same elements as in the first embodiment, and a description thereof is omitted.

The present embodiment is different from the first embodiment in that a random number generating circuit 31 for generating pseudorandom numbers based upon to an initial value IN is provided.

According to the present embodiment, upon testing, the reconfigurable circuit 10 is divided so as to form the RFUs 11, 12, 13, and the majority circuit 14 and random number generating circuit 31 are also constructed with part of the reconfigurable circuit 10. Meanwhile, the three divisions of the reconfigurable circuit 10 is a minimum number and it is permissible to divide into more than three.

Then, random numbers are generated by the random number generating circuit 31 so as to automatically produce input vectors and the same data is supplied to the respective RFUs 11–13. Like the aforementioned first embodiment, the majority circuit 14 compares the operation results of the RFUs 11–13 and outputs a flag FG through its output terminal.

Because according to the present embodiment, the random number generating circuit 31 for generating pseudorandom numbers is provided and the same data to be inputted to the RFUs 11–13 is data outputted from the random number generating circuit 31, combinations of the input vectors to be supplied to the RFUs 11–13 can be automatically carried out and no tester circuit is needed, so that the test procedure can be largely simplified.

Next, a third embodiment of the present invention will be described.

According to the third embodiment, the RFU information verified to be an error according to a result of comparison by the majority circuit 14 is stored.

Figure 5:
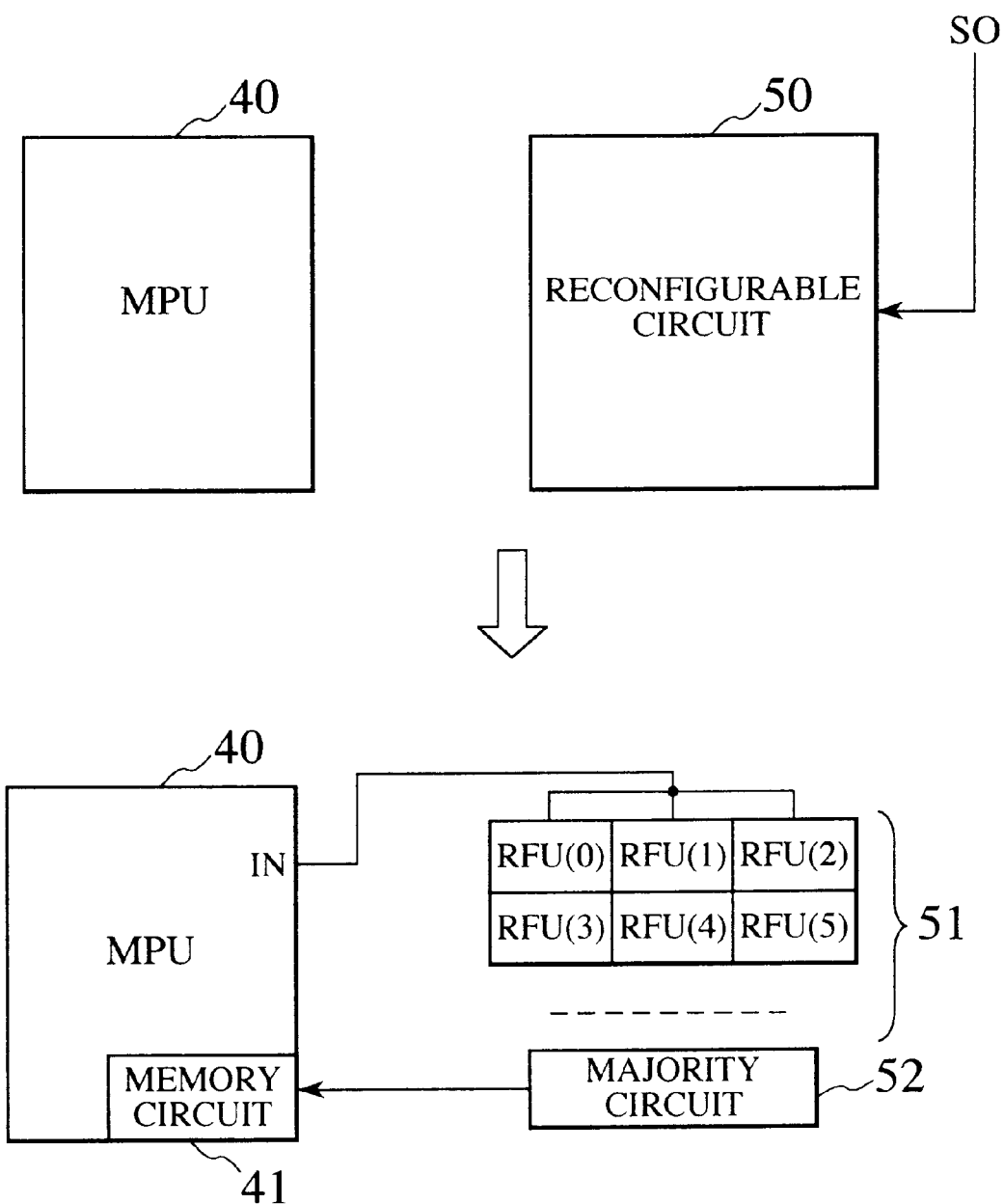
FIG. 5 is a diagram showing a test method for a semiconductor integrated circuit according to a third embodiment of the present invention.

FIG. 5 is a diagram showing a method for testing a semiconductor integrated circuit according to the third embodiment of the present invention.

The present embodiment contains a standard microprocessor (MPU) 40 and a reconfigurable circuit 50.

Upon testing, the RFU portion 51 is reconstructed so as to contain at least three or more equivalent RFU(0)–RFU(n) (n≧2) and the same data IN is supplied to these RFUs from the MPU. Further, a majority circuit 52 for comparing an operation result of the respective RFU(0)–RFU(n) is constructed with part of the reconfigurable circuit 50. A flag indicating an RFU in which an error occurs is stored in a memory 41 controlled by the MPU 40 so as to inhibit use of the RFU.

In the present embodiment, the tester circuit is not required, so that the testing operation can be simplified. Further, by inhibiting use of a faulty RFU, a circuit even containing a faulty RFU can be available and production cost can be lowered by increasing yield rate.

Next, a fourth embodiment of the present invention will be described.

Figure 6:
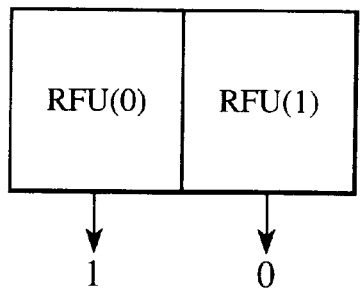
FIG. 6 is a diagram showing a test method for a semiconductor integrated circuit according to a fourth embodiment of the present invention.
Figure 6:
Figure 6:
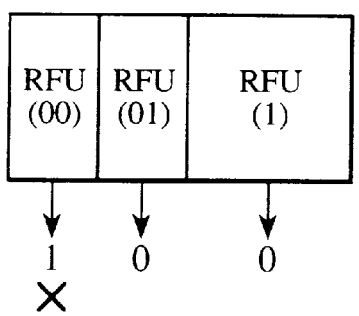
Figure 6:
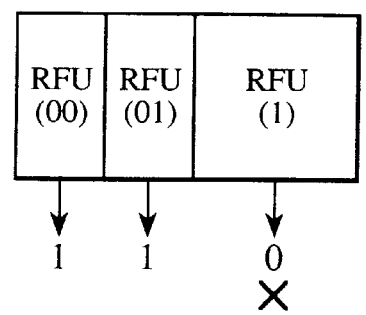
Figure 6:
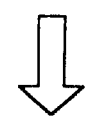
Figure 6:
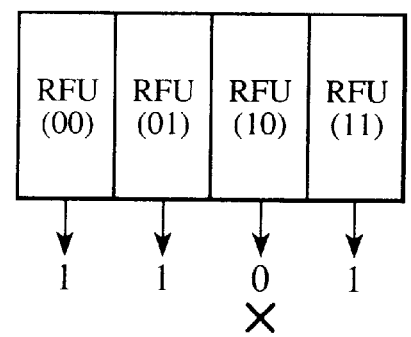

Although according to the first embodiment, the reconfigurable circuit 10 is simultaneously divided to three RFU (0)–RFU(2), it is not always necessary to divide to three or more simultaneously. As in the fourth embodiment shown in FIG. 6, this can be divided to three or more hierarchically in time series.

Namely, as shown in FIG. 6(a), at first the reconfigurable circuit 10 is divided into RFU(0) and RFU(1). At this time, assume that the results of the operation are "1" and "0" respectively when the same data is supplied to RFU(0) and RFU(1). At the moment, it is impossible to determine which is faulty, RFU(0) or RFU(1). Then, as shown in FIGS. 6(b), (c), the RFU(0) portion is further divided to two, namely RFU(00) and RFU(01). At this time, assume that when the same data is supplied to RFU(00), RFU(01), RFU(1), the results of operation are "1", "0", "0" respectively as shown in FIG. 6(b). Then, at the moment, it is made evident that the RFU(00) portion is faulty. On the other hand, assume that when the same data is supplied to RFU(00), RFU(01), RFU(1), the results of operations are "1", "1" and "0" respectively as shown in FIG. 6(c). Then, in this case, at the moment, it is made evident that the RFU(1) portion is faulty.

When it is made evident that the RFU(L) portion is faulty, the RFU(1) can be further divided to two, namely, RFU(10) and FRU(11) as shown in FIG. 6(d). At this time, assume that when the same data is supplied to RFU(10), RFU(11), the results of operation are "0", "1" respectively as shown in FIG. 6(d). Then, at the moment, it is made evident that the RFU(10) of the RFU(1) is faulty.

It is needless to say that, after the testing by dividing to two as shown in FIG. 6(a), the RFU(0) and RFU(1) may be simultaneously divided into two.

As described above, according to the semiconductor integrated circuit and method for testing it of the present invention, the reconfigurable circuit is reconstructed of three or more equivalent operating circuit blocks, so that upon testing, the same data can be inputted to each operating circuit block. Therefore, upon testing, the combination of the input vector can be reduced corresponding to division of the reconfigurable circuit, so that the testing procedure can be facilitated.

Further according to the semiconductor integrated circuit and method for testing of the present invention, a random number generating circuit for generating random numbers is provided, and as the same data to be inputted to each operating circuit block, output data of the random number generating circuit is used. Thus, combinations of the input vector to be supplied to each block can be automatically carried out, so that the tester circuit is not required, and thus the test procedure can be largely simplified.

Further, according to the semiconductor integrated circuit and method for testing of the present invention, there is a memory circuit for storing information of an operating circuit block which has been verified to be an error by comparing results of operations of respective operating circuit blocks which decide by majority. Therefore, by inhibiting use of the faulty block, the circuit containing that faulty block is not used, so that yield rate can be increased to lower production cost.

It should be understood that many modifications and adaptations of the invention will become apparent to those skilled in the art and it is intended to encompass such obvious modifications and changes in the scope of the claims appended hereto.

What is claimed is:

1. A semiconductor integrated circuit containing a reconfigurable circuit wherein a circuit structure thereof can be changed according to an external signal input thereto, said reconfigurable circuit being reconfigured to include three or more equivalent operating circuit blocks to which same data is inputted upon testing of said reconfigurable circuit.

2. A semiconductor integrated circuit according to claim 1 wherein said reconfigurable circuit is further reconfigured to include a comparing circuit for comparing the results of operations of said operating circuit blocks with each other and outputting information indicating whether any operating circuit block having a result of an operation which is different from any of respective results of other operating circuit blocks exists.

3. A semiconductor integrated circuit according to claim 2 further comprising a memory means for storing information of an operating circuit block having the result of the operation which is different from any of the respective results of the other operating circuit blocks.

4. A semiconductor integrated circuit according to claim 2 wherein said comparing circuit is a majority circuit.

5. A semiconductor integrated circuit according to claim 1 wherein said reconfigurable circuit is reconfigured so as to contain a random number generating circuit for generating random numbers as the same data.

6. A semiconductor integrated circuit according to claim 1 wherein each of said operating circuit blocks is constructed by connecting a plurality of 3-input lookup tables on multiple stages.

7. A semiconductor integrated circuit according to claim 1, comprising:
one of said operating circuit blocks being divided into at least two equivalent block portions, wherein same data is input to said at least two block portions during testing.

8. A test method for a semiconductor integrated circuit having a reconfigurable circuit wherein a circuit structure thereof can be changed according to an external signal input thereto, said test method comprising the steps of:
reconfiguring the reconfigurable circuit to include three or more equivalent operating circuit blocks and a comparing circuit;
inputting same data to each of said operating circuit blocks;
comparing results of operations of said circuit blocks with each other by said comparing circuit; and
outputting information indicating whether any operating circuit block having a result of an operation which is different from any of respective results of other operating circuit blocks exists.

9. A test method for a semiconductor integrated circuit according to claim 8 wherein:
in the reconfiguring step, the reconfigurable circuit is reconfigured to include a random number generating circuit, and
in the inputting step, the same data to be inputted to each of said operating circuit blocks is pseudorandom number data outputted from said random number generating circuit.

10. A test method for a semiconductor integrated circuit according to claim 8 further comprising the steps of:
storing the information of an operating circuit block having the result of the operation which is different from any of respective results of the other operating circuit blocks.

11. A test method for a semiconductor integrated circuit according to claim 8, comprising:
inputting an output of said operating circuit blocks to said comparing circuit; and
determining operability of said operating circuit blocks using said comparing circuit.

12. A test method for a semiconductor integrated circuit according to claim 11, comprising:
configuring an input circuit using said reconfigurable circuit; and
generating said data using said input circuit.

13. A test method for a semiconductor integrated circuit according to claim 8, comprising:
configuring an input circuit using said reconfigurable circuit; and
generating said data using said input circuit.

14. A test method for a semiconductor integrated circuit according to claim 8, comprising:
testing said operating circuit blocks and determining whether at least one of said blocks is faulty;
subdividing at least one of said operating circuit blocks into at least two equivalent operating circuit block portions; and
testing said at least two portions.

15. A test method for a semiconductor integrated circuit according to claim 14, wherein testing said at least two portions comprises inputting same data to each of said portions.

16. A test method for a semiconductor integrated circuit according to claim 14, comprising:
subdividing a second one of said operating circuit blocks into at least two second equivalent block portions; and
testing said second equivalent block portions.

* * * * *